United States Patent
Oyu et al.

(10) Patent No.: US 7,846,826 B2
(45) Date of Patent: Dec. 7, 2010

(54) METHOD OF MANUFACTURING A SEMICONDUCTOR DEVICE WITH MULTILAYER SIDEWALL

(75) Inventors: Kiyonori Oyu, Tokyo (JP); Kensuke Okonogi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 128 days.

(21) Appl. No.: 12/246,908

(22) Filed: Oct. 7, 2008

(65) Prior Publication Data

US 2009/0042380 A1 Feb. 12, 2009

Related U.S. Application Data

(62) Division of application No. 11/246,337, filed on Oct. 11, 2005.

(30) Foreign Application Priority Data

Oct. 15, 2004 (JP) .............................. 2004-301612

(51) Int. Cl.
*H01L 21/3205* (2006.01)
*H01L 21/4763* (2006.01)
(52) U.S. Cl. .................. 438/592; 438/593; 438/265; 438/694
(58) Field of Classification Search ................ 438/592, 438/593, 265
See application file for complete search history.

(56) References Cited

U.S. PATENT DOCUMENTS

| | | | | |
|---|---|---|---|---|
| 5,925,918 | A * | 7/1999 | Wu et al. ................ | 257/413 |
| 6,514,842 | B1 * | 2/2003 | Prall et al. ............... | 438/593 |
| 6,555,865 | B2 | 4/2003 | Lee et al. | |
| 6,992,010 | B2 * | 1/2006 | Chou et al. ............. | 438/694 |
| 2003/0040183 | A1 * | 2/2003 | Kujirai et al. ........... | 438/694 |

(Continued)

FOREIGN PATENT DOCUMENTS

JP 10-050631 2/1998

(Continued)

OTHER PUBLICATIONS

United States Office Action issued in U.S. Appl. No. 11/246,337 dated Dec. 24, 2009.

(Continued)

*Primary Examiner*—Kenneth A Parker
*Assistant Examiner*—David Z Chen
(74) *Attorney, Agent, or Firm*—McDermott Will & Emery LLP (57) ABSTRACT

A gate dielectric film, a poly-silicon film, a film of a refractory metal such as tungsten, and a gate cap dielectric film are sequentially laminated on a semiconductor substrate. The gate cap dielectric film and the refractory metal film are selectively removed by etching. Thereafter, a double protection film including a silicon nitride film and a silicon oxide film is formed on side surfaces of the gate cap dielectric film, the refractory metal film, and the poly-silicon film. The poly-silicon film is etched using the double protection film as a mask. Thereafter, the semiconductor substrate is light oxidized to form a silicon oxide film on side surfaces of the poly-silicon film. Accordingly, a junction leakage of a MOSFET having a gate electrode of a poly-metal structure, particularly, a memory cell transistor of a DRAM, can be further reduced.

10 Claims, 12 Drawing Sheets

U.S. PATENT DOCUMENTS

2003/0205811 A1* 11/2003 Nakamura et al. ........... 257/751
2005/0095793 A1* 5/2005 Lee ............................. 438/294

FOREIGN PATENT DOCUMENTS

| | | |
|---|---|---|
| JP | 10-189974 A | 7/1998 |
| JP | 2000-091564 | 3/2000 |
| JP | 2000-156497 | 6/2000 |
| JP | 2000-156497 A | 6/2000 |
| JP | 2000-340792 | 12/2000 |
| JP | 2002-141500 A | 5/2002 |
| JP | 2003-068878 | 3/2003 |
| JP | 2003-68878 A | 3/2003 |
| WO | WO 98/37583 | 8/1998 |

OTHER PUBLICATIONS

Japanese Office Action, with partial English translation, issued in Japanese Patent Application No. JP 2004-301612, mailed Oct. 30, 2007.

* cited by examiner

METHOD OF MANUFACTURING A SEMICONDUCTOR DEVICE WITH MULTILAYER SIDEWALL

RELATED APPLICATIONS

This application is a divisional of application Ser. No. 11/246,337, filed on Oct. 11, 2005, which in turn claims the benefit of Japanese Application No. 2004-301612, filed on Oct. 15, 2004, the disclosures of which Applications are incorporated by reference herein.

FIELD OF THE INVENTION

The present invention relates to a semiconductor device and a method of manufacturing the same. The invention particularly relates to a metal-oxide semiconductor field-effect transistor (MOSFET) having a gate electrode of a poly-metal structure consisting of high-melting point metal and poly-crystalline silicon (poly-silicon), and a method of manufacturing the MOSFET.

BACKGROUND OF THE INVENTION

Recently, in a MOSFET that is used for a memory cell such as a dynamic random access memory (DRAM), a so-called poly-metal structure gate electrode (poly-metal gate) having a refractory metal film such as tungsten stacked on a poly-silicon film is used in order to reduce resistance of a gate electrode (see Japanese Patent Application Laid-Open Nos. 2000-156497 and 2002-141500).

On the other hand, at the time of patterning the gate electrode, a gate dielectric film positioned at a lower part of the gate electrode is also slightly etched. Therefore, a breakdown voltage of the gate dielectric film decreases and a leak current increases in this state. In order to prevent this problem, conventionally, after the gate electrode is patterned, an oxide film is formed on a side surface of the gate electrode. In other words, a so-called light oxidation is carried out.

However, when the gate electrode has a poly-metal structure, a refractory metal scatters to a silicon substrate during the light oxidation, which substantially increases a junction leakage.

As methods for solving this problem, a pamphlet of International Publication No. 98/37583 and Japanese Patent Application Laid-Open Nos. H10-189974 and 2003-68878 disclose techniques of preventing a scattering of a refractory metal film by executing a light oxidation after covering side surfaces of the refractory metal film that constitutes a poly-metal gate with a silicon nitride film.

SUMMARY OF THE INVENTION

However, according to researches carried out by the inventors of the invention, it is made clear that it is difficult to reduce a junction leakage to a predetermined level or lower even when a light oxidation is carried out after covering the side surfaces of a refractory metal film with a silicon nitride film. Since this junction leakage increases power consumption, it is desirable to reduce the junction leakage as much as possible. Particularly, in a semiconductor device that stores an extremely small amount of electric charge such as a DRAM, a slight amount of junction leakage directly leads to a reduction in refresh characteristic. Therefore, it is particularly important to reduce the junction leakage.

It is therefore an object of the present invention to provide a semiconductor device that can reduce a junction leakage of a MOSFET having a gate electrode of a poly-metal structure, particularly, a memory cell transistor of a DRAM.

The inventors have carried out detailed researches into the phenomenon in which the junction leakage does not decrease to a predetermined level or lower even when a light oxidation is carried out after covering the side surfaces of a refractory metal film with a silicon nitride film. It is found through the research that the silicon nitride film that covers the side surfaces of the refractory metal film has many defects. These defects are considered to be attributable to damages caused, by etching, to a part where the silicon nitride film remains to cover the side surfaces of the refractory metal film, at the time of etching back the silicon nitride film.

The present invention has been achieved based on the above technical knowledge. According to the present invention, there is provided a semiconductor device including: a semiconductor substrate; a gate dielectric film formed on the semiconductor substrate; a poly-metal gate electrode having at least a poly-silicon film and a refractory metal film formed on the gate dielectric film; a gate cap that covers an upper surface of the poly-metal gate electrode; and a sidewall that covers side surfaces of the poly-metal gate electrode. The sidewall has a multilayer structure including at least a first dielectric film and a second dielectric film made of a material different from that of the first dielectric film. The first dielectric film has a vertical part that is in contact with the side surfaces of the poly-metal gate electrode, and a horizontal part that extends substantially parallel with a front surface of the semiconductor substrate from the gate dielectric film side end at the vertical part.

According to the present invention, the sidewall that covers the side surfaces of the poly-metal gate electrode has a multilayer structure. Therefore, serious defects do not occur in the sidewall. Consequently, it is possible to effectively prevent a scattering of the refractory metal contained in the poly-metal gate electrode. Accordingly, junction leakage attributable to the refractory metal can be reduced substantially.

In order to reinforce the sidewall, there is also considered a method of increasing a film thickness of the sidewall in a single-layer structure, instead of in a multilayer structure as in the present invention. However, according to this method, the amount of etch back increases corresponding to the increased film thickness, and the damage on the sidewall increases. On the other hand, based on the structure of the sidewall according to the present invention, at the time of etching back the external dielectric film (the second dielectric film, for example), little damage is caused on the internal dielectric film (the first dielectric film, for example). At the time of etching the internal dielectric film (the first dielectric film), a part covered with the external dielectric film (the second dielectric film) is protected. Consequently, a sidewall (the first dielectric film) with a very small amount of defects can be finally obtained.

According to the present invention, there is provided a method of manufacturing a semiconductor device, the method including: a first step of forming a gate dielectric film on a semiconductor substrate; a second step of forming at least a poly-silicon film and a refractory metal film on the gate dielectric film; a third step of patterning at least the refractory metal film; a fourth step of forming a sidewall having a multilayer structure on side surfaces of the patterned refractory metal film; a fifth step of patterning the poly-silicon film; and a sixth step of oxidizing the side surfaces of the patterned poly-silicon film.

According to the present invention, the poly-silicon film is patterned and the light oxidation is carried out after the sidewalls having a multilayer structure are formed on the side surfaces of the refractory metal film. Therefore, a scattering of the refractory metal can be effectively prevented at the time of light oxidizing the poly-silicon film.

The fourth step can include: a step of depositing a silicon nitride film; a step of depositing a silicon oxide film on the silicon nitride film; a step of etching back the silicon oxide film; and a step of etching the silicon nitride film using the silicon oxide film as a mask. Based on this arrangement, the silicon nitride film is hardly damaged at the time of etching back the silicon oxide film. Further, at the time of etching the silicon nitride film, the part covered with the silicon oxide film is protected. Accordingly, a sidewall (silicon nitride film) with a very small amount of defects can be formed.

BRIEF DESCRIPTION OF THE DRAWINGS

It is therefore an object of the present invention to provide a multilayer substrate and a method of manufacturing the same, which can offer a high degree of design freedom and arbitrary selection of optimal pattern shapes and variations required in various electronic elements.

DETAILED DESCRIPTION OF THE EMBODIMENTS

Preferred embodiments of the present invention will now be described in detail with reference to the accompanying drawings.

FIG. 1 to FIG. 21 is schematic cross sections of processes of a method of manufacturing a semiconductor device according to the exemplary embodiment of the present invention. In the present embodiment, the manufacturing method according to the present invention is applied to a DRAM.

Figure 1:
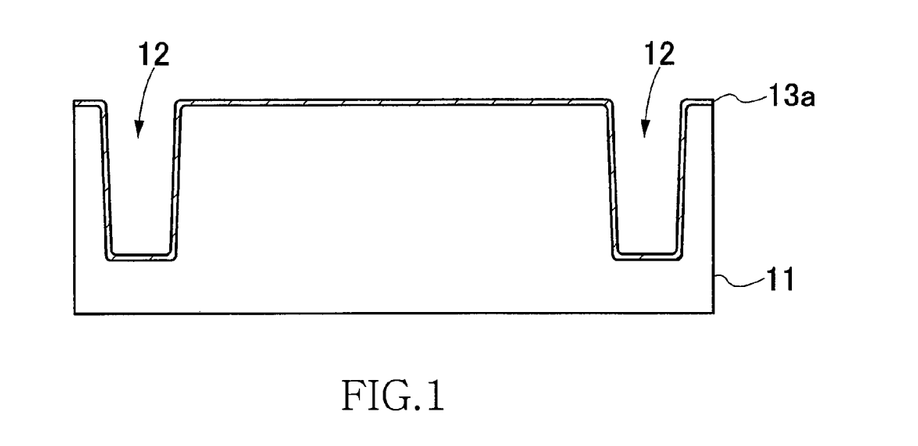
FIG. 1 is a schematic cross section of one process (a formation of an element isolation trench 12 and a silicon oxide film 13a) of a method of manufacturing a semiconductor device according to an exemplary embodiment of the present invention.

First, as shown in FIG. 1, a semiconductor substrate 11 made of p-type mono-crystalline silicon having a specific resistance of about 1 to 10 Ω/cm is etched, thereby forming an element isolation trench 12 having a depth of about 350 nm. The semiconductor substrate 11 is thermally oxidized at about 1,000° C., thereby forming a silicon oxide film 13a as thin as about 10 nm on an inner wall of the element isolation trench 12. This silicon oxide film 13a is formed to repair a damage generated on the inner wall of the element isolation trench 12 due to the etching, and to alleviate a stress generated on the interface between the semiconductor substrate 11 and an oxide silicon film 13b embedded in the element isolation trench 12 at the next process.

Figure 2:
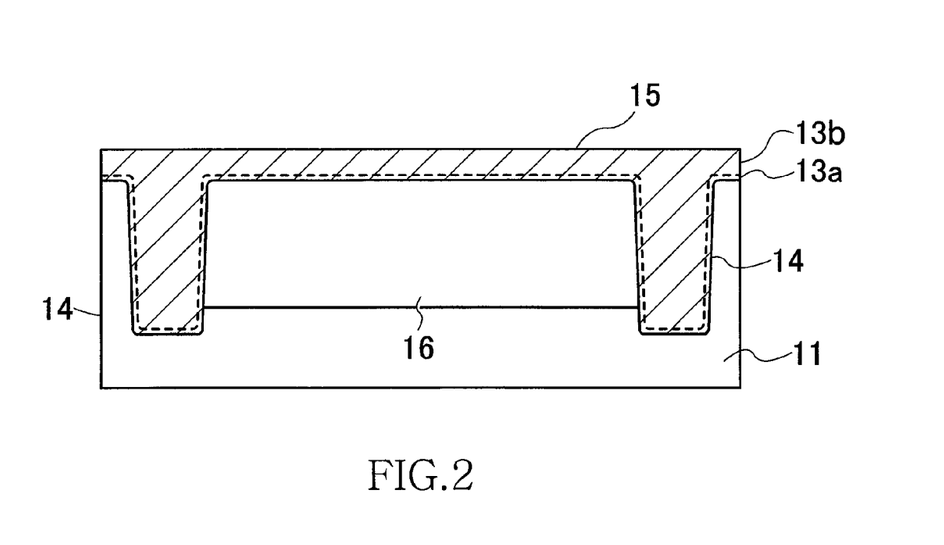
FIG. 2 is a schematic cross section of one process (a formation of an STI 14 to a formation of a p-type well layer 16) of the method of manufacturing a semiconductor device according to the embodiment.

As shown in FIG. 2, the silicon oxide film 13b having a film thickness of about 450 to 500 nm is then deposited on the entire surface of the semiconductor substrate 11 including the element isolation trench 12, by a chemical vapor deposition (CVD) method. Thereafter, the silicon oxide film 13b is ground by a chemical mechanical polishing (CMP) method, and the surface of the silicon oxide film 13b is flattened, thereby forming a shallow trench isolation (STI) 14 and a protection film 15 for forming a well layer having a film thickness of about 15 nm. Then, an impurity such as boron (B) is ion implanted into the semiconductor substrate 11 via the protection film 15, thereby forming a p-type well layer 16 inside the semiconductor substrate 11.

Figure 3:
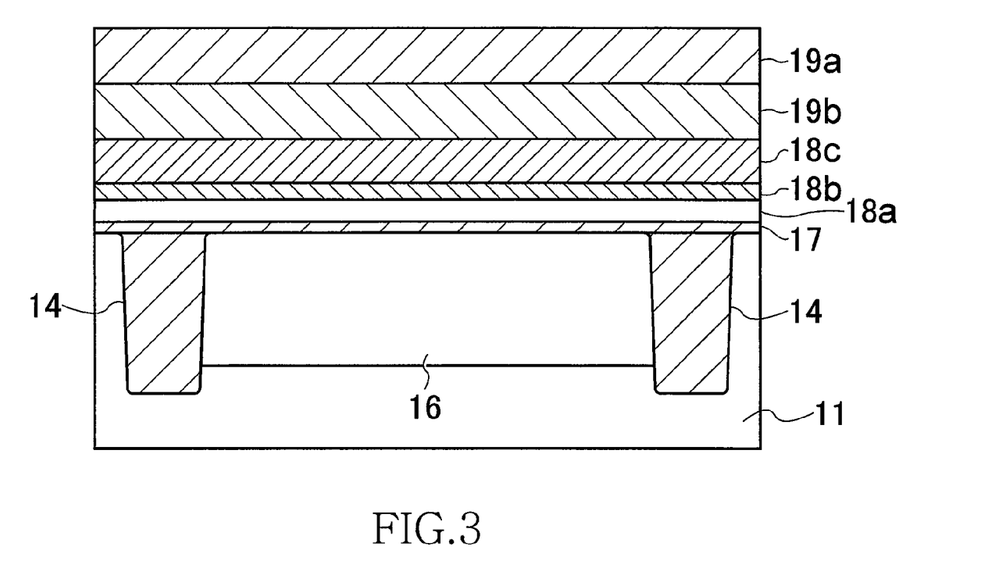
FIG. 3 is a schematic cross section of one process (a formation of a gate dielectric film 17 to a formation of a silicon oxide film 19b) of the method of manufacturing a semiconductor device according to the embodiment.

As shown in FIG. 3, the unnecessary protection film 15 is removed, and the surface of the semiconductor substrate 11 (the p-type well layer 16) is then wet-cleaned using a hydrofluoric acid cleaning solution. Then, a gate dielectric film 17 having a film thickness of about 6 to 7 nm is formed on the surface of the semiconductor substrate 11 by thermal oxidation at around 800° C. A low-resistance poly-silicon film (hereinafter, simply referred to as a poly-silicon film) 18a having a film thickness of about 70 to 100 nm doped with phosphor (P) is deposited on the surface of the gate dielectric film 17, by the CVD method. A tungsten nitride (WNx) film 18b having a film thickness of about 5 to 15 nm and a tungsten (W) film 18c having a film thickness of about 80 to 100 nm are sequentially deposited on the surface of the poly-silicon film 18a, by a sputtering method. Further, a silicon nitride film 19b and a silicon oxide film 19a having a film thickness of about 100 to 200 nm respectively are sequentially deposited on the surface of the tungsten film 18c, by the CVD method.

The tungsten film 18c is a metal film for reducing a sheet resistance of the gate electrode. The tungsten nitride film 18b functions as a barrier layer between the tungsten film 18c and the poly-silicon film 18a. In other words, when the tungsten film 18c is directly formed on the poly-silicon film 18a, the tungsten film 18c reacts with the poly-silicon film 18a to form silicide, and increases the resistance. Therefore, in order to prevent this increase in the resistance, the tungsten nitride film 18b is provided.

The silicon oxide film 19a has high etching selectivity to the poly-silicon film 18a, the tungsten nitride film 18b, and the tungsten film 18c. Therefore, the silicon oxide film 19a is used as a mask to etch these films. The silicon nitride film 19b is used as a barrier layer between the tungsten film 18c and the silicon oxide film 19a. In other words, when the silicon oxide film 19a is directly formed on the tungsten film 18c, the tungsten film 18c is abnormally oxidized, and has a high resistance. At the same time, the surface of the tungsten film 18c becomes very poor. Therefore, in order to prevent these problems, the silicon nitride film 19b is provided.

Figure 4:
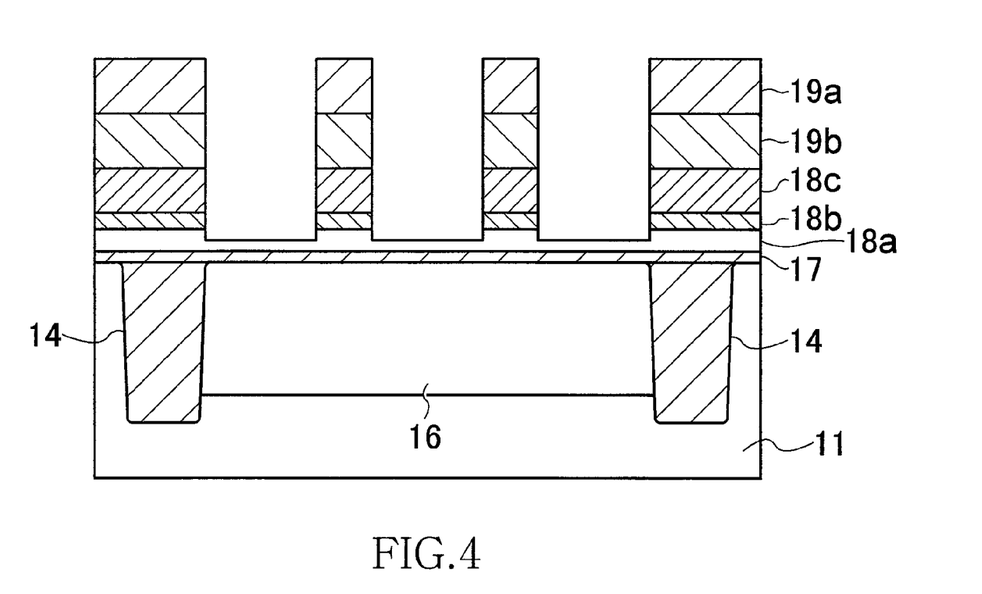
FIG. 4 is a schematic cross section of one process (a formation of a tungsten film 18c and a patterning of a tungsten nitride film 18b) of the method of manufacturing a semiconductor device according to the embodiment.

As shown in FIG. 4, a resist pattern (not shown) is then formed in a predetermined area where the gate electrode is to be formed, and the silicon oxide film 19b and the silicon nitride film 19a are etched by a magnetron reactive ion etching (RIE) method using this resist pattern as a mask, thereby forming a gate cap 19 consisting of the silicon oxide film 19b and the silicon nitride film 19a. After the resist pattern is removed, the tungsten film 18c and the tungsten nitride film 18b are etched by a plasma etching method of an electron cyclotron resonance (ECR) system, using the gate cap 19 as a mask. In this case, preferably, the poly-silicon film 18a is over-etched. For this purpose, the poly-silicon film 18a needs to be left to some extent on the gate dielectric film 17.

The poly-silicon film 18a is over-etched in order to completely cover the tungsten film 18c and the tungsten nitride film 18b with a sidewall to be described later. The poly-silicon film 18a is left on the semiconductor substrate 11 (the gate dielectric film 17) for the following reason. If the gate dielectric film 17 is exposed before forming the sidewall, tungsten and its oxide (for example, $WO_3$) are adhered to the gate dielectric film 17, because the tungsten film 18c and the tungsten nitride film 18b are also exposed by the etching. On the other hand, if the poly-silicon film 18a remains, this film becomes a protection film, and can prevent a metal contamination of the gate dielectric film.

Figure 5:
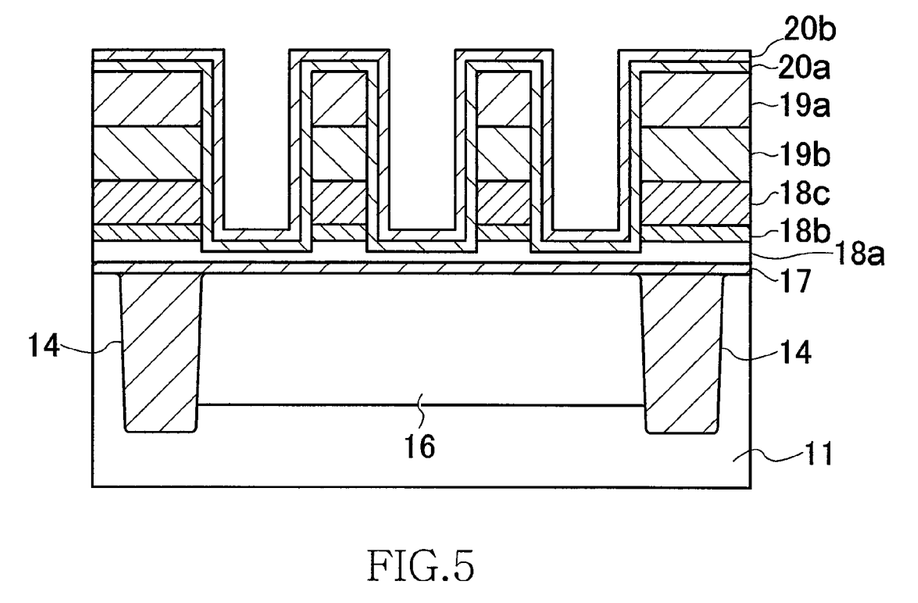
FIG. 5 is a schematic cross section of one process (a formation of a silicon nitride film 20a and a silicon oxide film 20b) of the method of manufacturing a semiconductor device according to the embodiment.

As shown in FIG. 5, a silicon nitride film ($Si_3N_4$) 20a is then deposited to have a film thickness of about 10 to 20 nm on the entire surface of the gate electrode-processed semiconductor substrate 11, by a low pressure chemical vapor deposition (LPCVD) method. Then, a silicon oxide film ($SiO_2$) 20b is deposited to have a film thickness of about 10 to 20 nm on the surface of the silicon nitride film, by the LPCVD method. Accordingly, side surfaces of the tungsten film 18c are covered with the silicon nitride film 20a and the silicon oxide film 20b.

The silicon nitride film 20a is used as an internal dielectric film of the gate electrode because the silicon nitride film 20a does not react with the tungsten film 18c even when the silicon nitride film 20a is brought into contact with the tungsten film 18c. The silicon oxide film 20b is used as an external dielectric film because the silicon oxide film 20b has high etching selectivity to the silicon nitride film. Therefore, a dielectric film made of other material can be used as long as the material satisfies these conditions. For example, for the external dielectric film, a silicon oxynitride film ($SiNO_3$) can be used in place of the silicon oxide film 20b.

Figure 6:
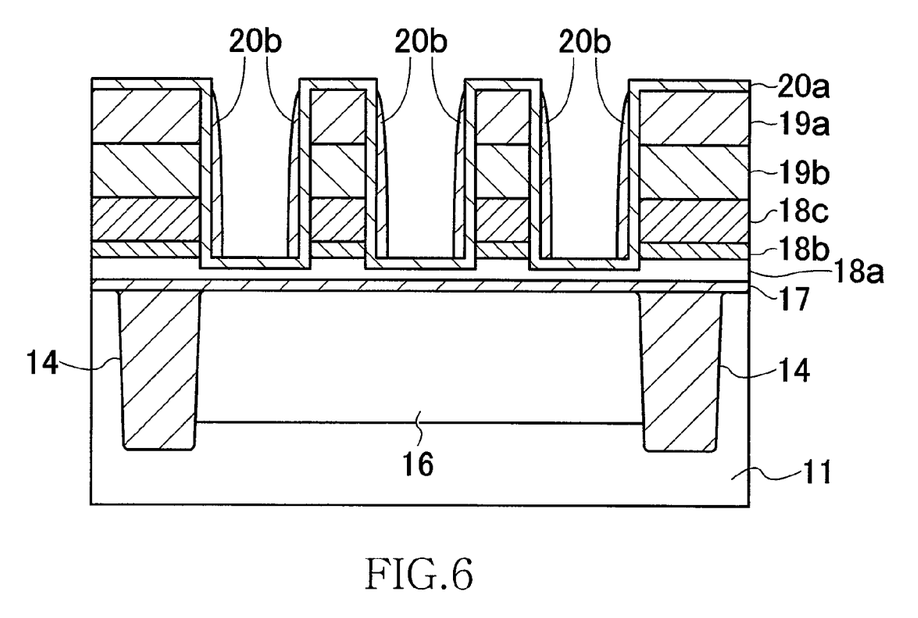
FIG. 6 is a schematic cross section of one process (an etching back of the silicon oxide film 20b) of the method of manufacturing a semiconductor device according to the embodiment.

As shown in FIG. 6, the silicon oxide film 20b is then etched back. Accordingly, all the silicon oxide films 20b formed on the surfaces substantially parallel with the surface of the semiconductor substrate 11 are removed, and only the silicon oxide film 20b formed on the surfaces substantially perpendicular to the surface of the semiconductor substrate 11 remains. In this case, the silicon oxide film 20b at the sidewall parts may get damaged, thereby causing a defect. However, since the silicon oxide film 20b can secure high etching selectivity to the silicon nitride film 20a, the silicon nitride film 20a is not damaged when the silicon oxide film 20b is etched.

Figure 7:
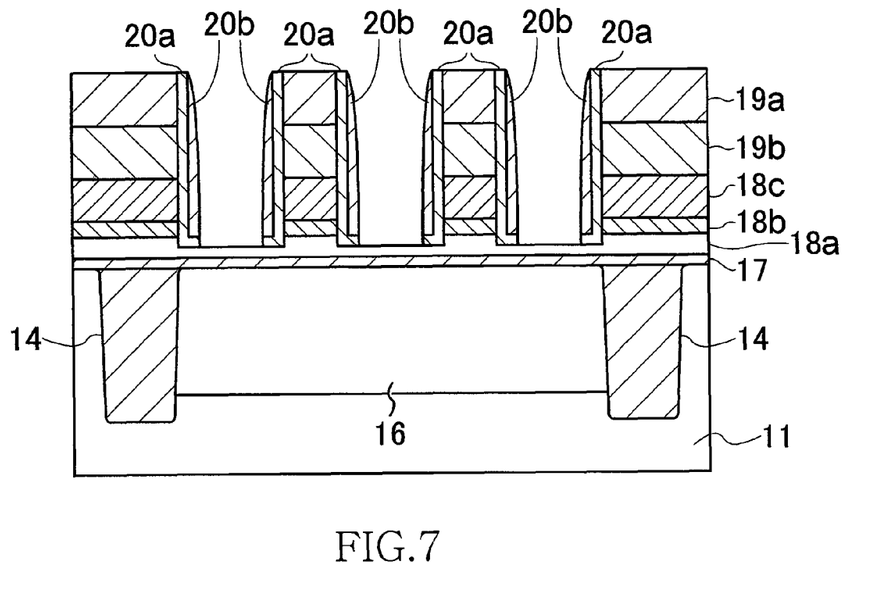
FIG. 7 is a schematic cross section of one process (an etching of the silicon nitride film 20a) of the method of manufacturing a semiconductor device according to the embodiment.

As shown in FIG. 7, the silicon nitride film 20a is then etched using the remaining silicon oxide film 20b as a mask. Accordingly, all the silicon nitride film 20a is removed except the part covered with the silicon oxide film 20b. Since the remaining silicon nitride film 20a is covered with the silicon oxide film 20b, the silicon nitride film 20a is not directly exposed to the etching atmosphere, and is not damaged accordingly. In other words, the remaining silicon nitride film 20a becomes a state having substantially no defect. Further, since the poly-silicon film 18a remains, the gate dielectric film 17 is not damaged at etching the silicon nitride film 20a. Consequently, a sidewall 20 having a multilayer structure consisting of the silicon nitride film 20a and the silicon oxide film 20b is formed on the side surfaces of the gate electrode.

Figure 8:
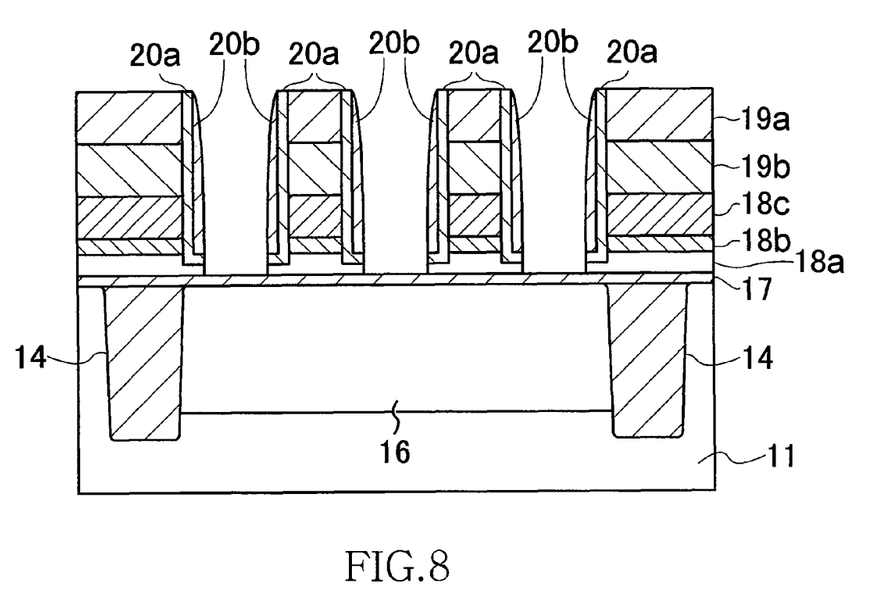
FIG. 8 is a schematic cross section of one process (an etching of a poly-silicon film 18a) of the method of manufacturing a semiconductor device according to the embodiment.

As shown in FIG. 8, the poly-silicon film 18a is then etched using the gate cap 19 and the sidewall 20 as a mask. Accordingly, the poly-silicon film 18a in the area between the gate electrodes is completely removed, and the gate dielectric film 17 is exposed in this area. The side surfaces of the poly-silicon film 18a constituting the gate electrode are also exposed.

Figure 9:
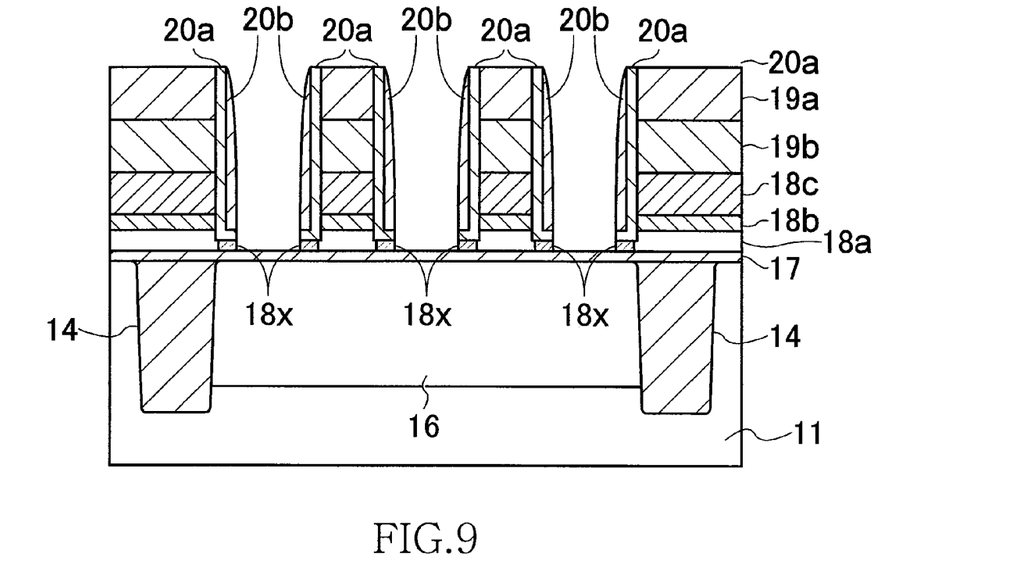
FIG. 9 is a schematic cross section of one process (a formation of a light oxide film 18x) of the method of manufacturing a semiconductor device according to the embodiment.

As shown in FIG. 9, the semiconductor substrate 11 is then thermally oxidized at about 800 to 900° C. in the wet hydrogen atmosphere, thereby forming a thin silicon oxide film (a light oxide film) 18x on the side surfaces of the poly-silicon film 18a and improving the film quality of the gate dielectric film 17 at the gate edge. Accordingly, the light oxide film 18x is formed on the side surface of the poly-silicon film 18a stripped by the etching, and the gate dielectric film 17 damaged by the etching is repaired.

Tungsten and its oxide are not scattered at the time of forming the light oxide film 18x, because the sidewall 20 has a double film of the silicon nitride film 20a and the silicon oxide film 20b. Therefore, the influence of contamination due to the scattering can be securely prevented. In other words, when the gate electrode is covered with only the silicon nitride film 20a, the silicon nitride film 20a on the sidewall is unavoidably damaged at the etching back time. Tungsten leaks out from the defect part, and is scattered to the gate dielectric film 17. On the other hand, according to the present embodiment, since the sidewall 20 has a double structure, the silicon nitride film 20a on the sidewall is not exposed to the etching atmosphere at the time of etching the silicon nitride film 20a. Consequently, the silicon nitride film 20a on the sidewall is not damaged. Accordingly, a scattering of tungsten and its oxide can be prevented securely, and metal contamination of the gate dielectric film 16 can be prevented completely. The processing of the gate electrode 18 is thus completed.

Figure 10:
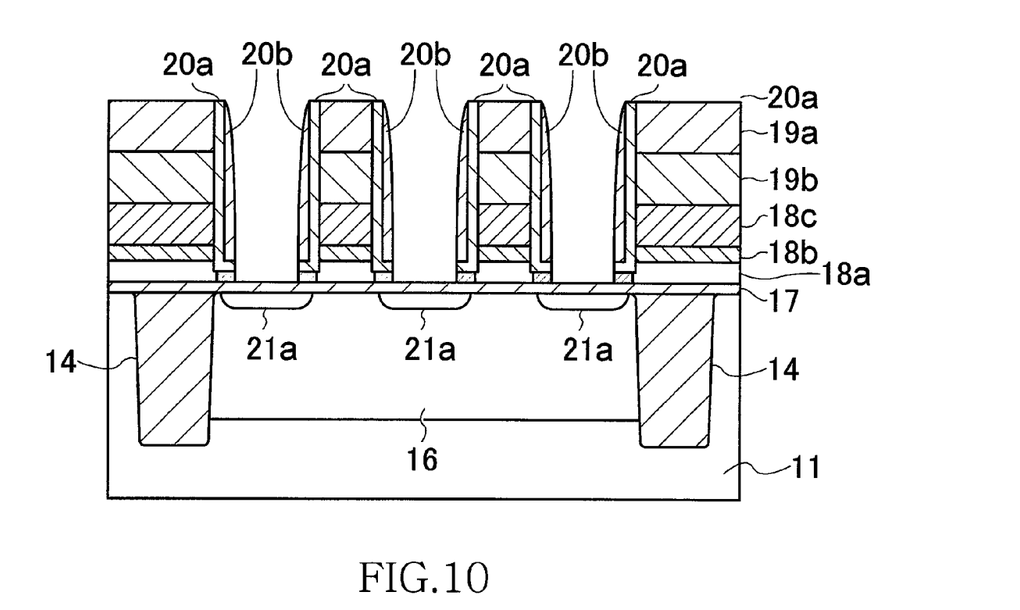
FIG. 10 is a schematic cross section of one process (a formation of a diffused area 21a) of the method of manufacturing a semiconductor device according to the embodiment.

As shown in FIG. 10, an n-type impurity (phosphor) is then ion implanted into the semiconductor substrate 11 at both sides of the gate electrodes, thereby forming n-type shallow diffused areas 21a on the gate electrodes in self-alignment near the surface of the semiconductor substrate 11.

Figure 11:
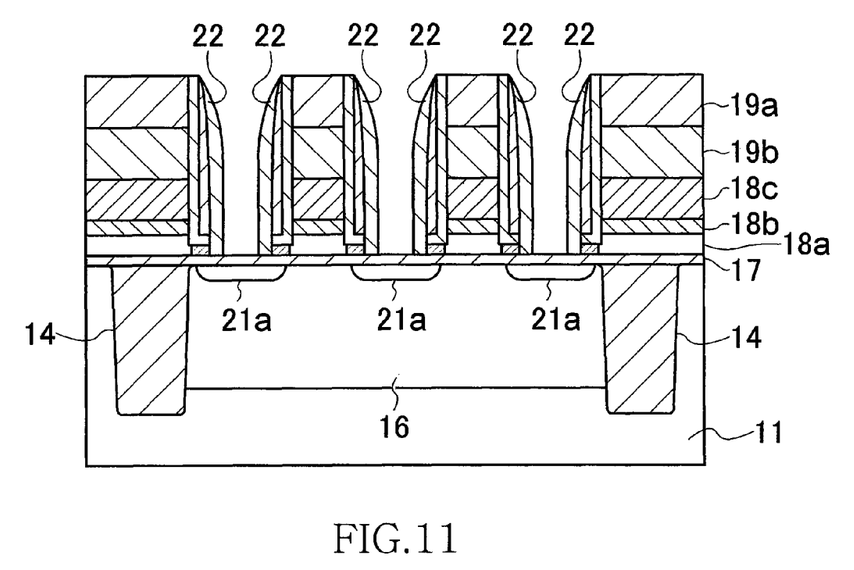
FIG. 11 is a schematic cross section of one process (a formation of a silicon nitride film 22 (a side spacer)) of the method of manufacturing a semiconductor device according to the embodiment.

As shown in FIG. 11, a silicon nitride film is then deposited to have a film thickness of about 40 nm on the entire surface of the semiconductor substrate 11 by the CVD method. The silicon nitride film is etched back to form a silicon nitride film 22 on only the side surfaces of the gate electrodes. This silicon nitride film 22 is called a side spacer. The side spacer, together with the sidewall 20, functions to secure electric dielectric between the gate electrode and a contact hole, described later. (The side spacer is also used as an ion injection guide at the time of forming a deep diffused area, described later.)

Figure 12:
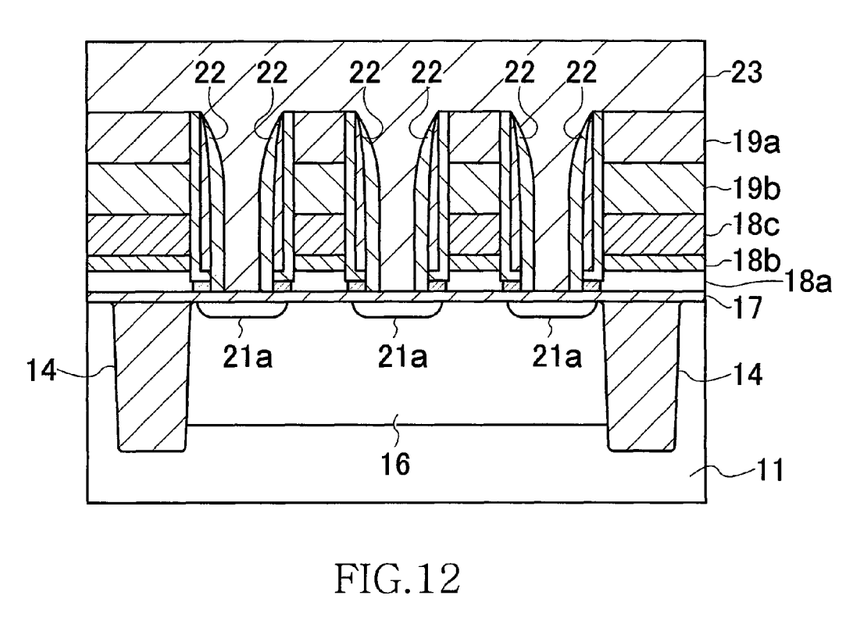
FIG. 12 is a schematic cross section of one process (a formation of a silicon oxide film 23) of the method of manufacturing a semiconductor device according to the embodiment.
Figure 13:
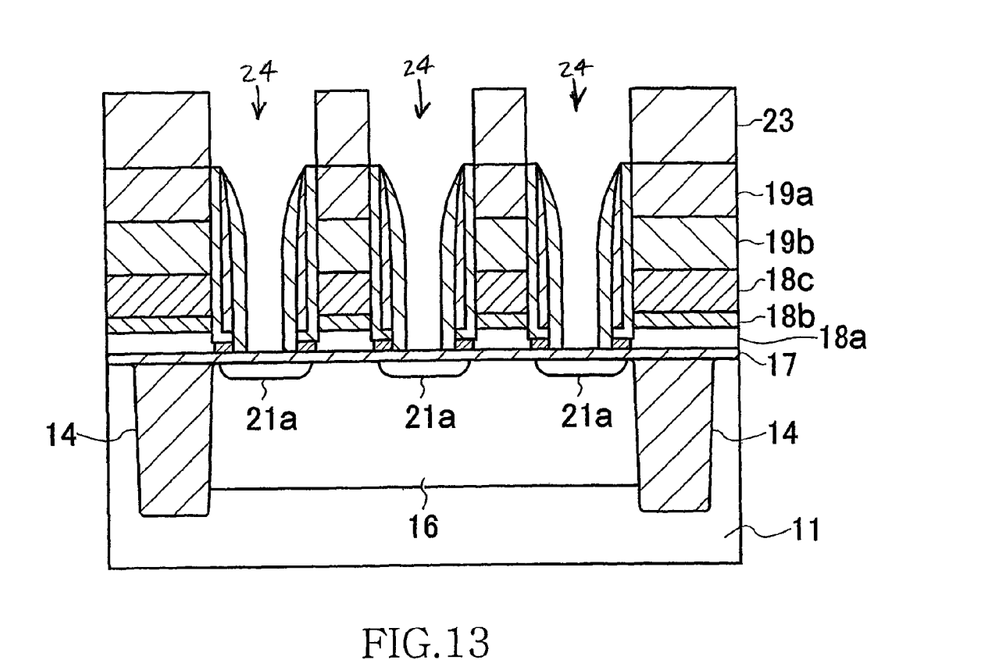
FIG. 13 is a schematic cross section of one process (a formation of contact holes 24) of the method of manufacturing a semiconductor device according to the embodiment.

As shown in FIG. 12, a thick silicon oxide film 23 is then deposited on the entire surface of the semiconductor substrate 11 formed with the above films, by the CVD method, and the silicon oxide film 23 is ground and its surface is flattened by the CMP method. As shown in FIG. 13, the silicon oxide film 23 is dry etched using a photo-resist (not shown) as a mask, thereby forming contact holes 24 on the upper part of the n-type shallow diffused areas 21a. The remaining silicon oxide film 23 forms a so-called interlayer dielectric film. The silicon oxide film 23 is etched in the condition that the silicon oxide film 23 has large etching selectivity to the silicon nitride film.

Figure 14:
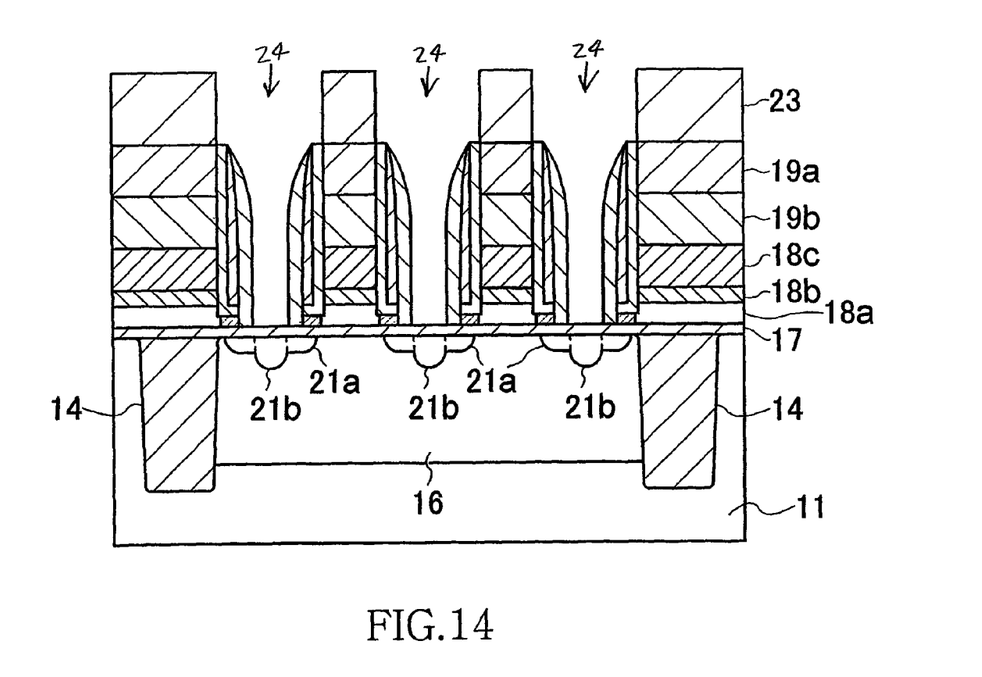
FIG. 14 is a schematic cross section of one process (a formation of a diffused area 21b) of the method of manufacturing a semiconductor device according to the embodiment.

As shown in FIG. 14, an n-type impurity such as phosphor (P) and arsenic (As) is then ion implanted into the n-type shallow diffused area 21a through the contact holes 24, thereby forming deep diffused areas 21b for electrolytic relaxation. Accordingly, an n-type diffused area (a source and drain area) 21 including the shallow diffused area 21a and the deep diffused area 21b is formed on the gate electrodes in self-alignment.

Figure 15:
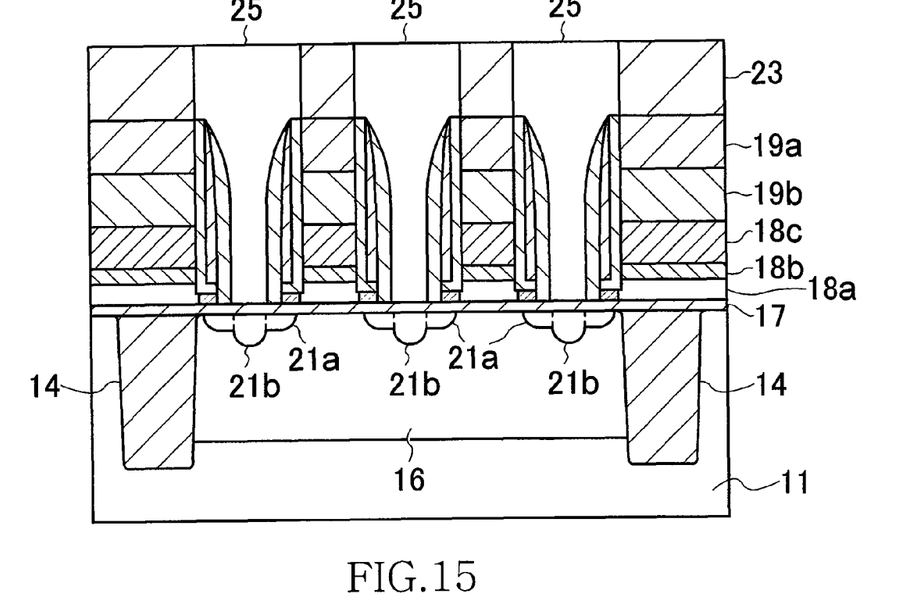
FIG. 15 is a schematic cross section of one process (a formation of first plugs 25) of the method of manufacturing a semiconductor device according to the embodiment.
Figure 16:
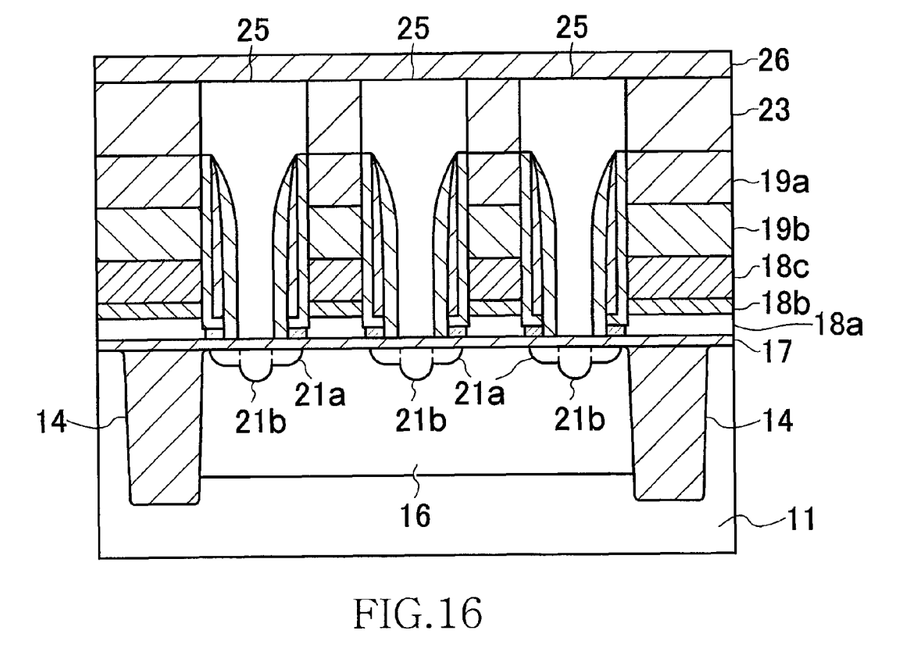
FIG. 16 is a schematic cross section of one process (a formation of a silicon oxide film 26) of the method of manufacturing a semiconductor device according to the embodiment.
Figure 17:
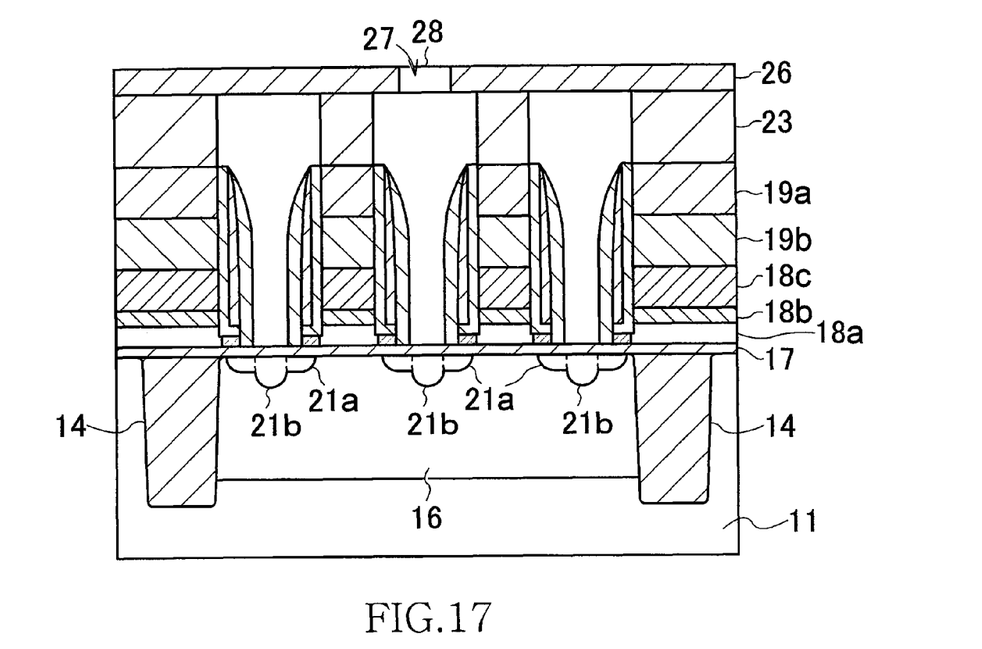
FIG. 17 is a schematic cross section of one process (a formation of a through-hole 27) of the method of manufacturing a semiconductor device according to the embodiment.

A transistor part of the memory cell of the DRAM is completed in the above process. Thereafter, a bit line and a capacitor of the DRAM are formed using a general method. In other words, after the exposed parts of the gate dielectric film 17 are removed, first plugs 25 are embedded into the contact holes 24 as shown in FIG. 15. As shown in FIG. 16, a silicon oxide film 26 is deposited to have a film thickness of about 100 nm on the surface of the silicon oxide film (the interlayer dielectric film) 23 by the CVD method. Then, as shown in FIG. 17, this silicon oxide film 26 is dry etched, thereby forming a through-hole 27 on the upper part of the first plug 25 at the center among three first plugs 25 shown in FIG. 17.

Figure 18:
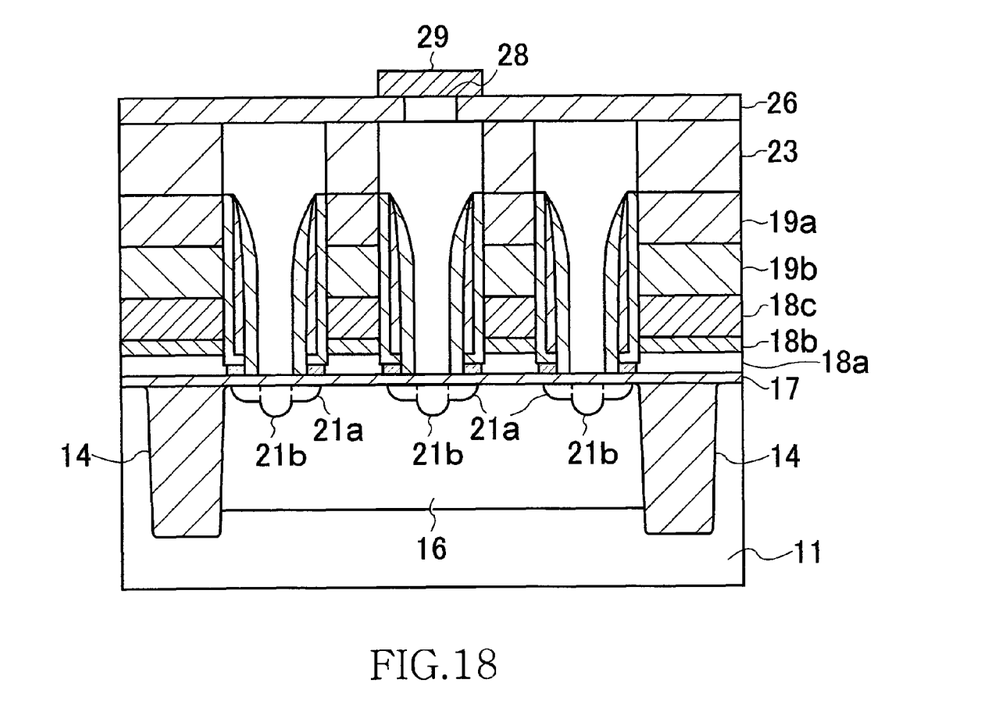
FIG. 18 is a schematic cross section of one process (a formation of a bit line 28) of the method of manufacturing a semiconductor device according to the embodiment.
Figure 19:
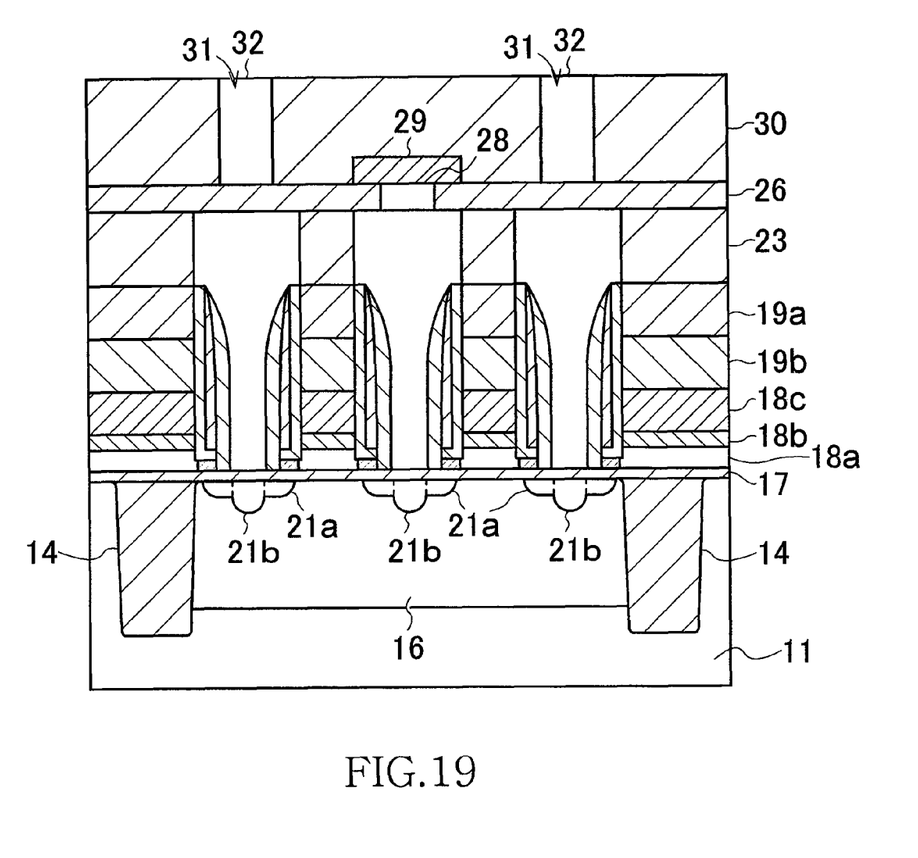
FIG. 19 is a schematic cross section of one process (a formation of a silicon oxide film 29 to a formation of second plugs 31) of the method of manufacturing a semiconductor device according to the embodiment.

As shown in FIG. 18, a bit line 28 is formed on the upper part of the through-hole 27. Next, as shown in FIG. 19, a silicon oxide film 29 is deposited on the surface of the silicon oxide film 26 on which the bit line 28 is formed. Thereafter, through-holes 30 are formed on the upper parts of the two first plugs 25 at both sides among the three first plugs 25 shown in FIG. 19.

Figure 20:
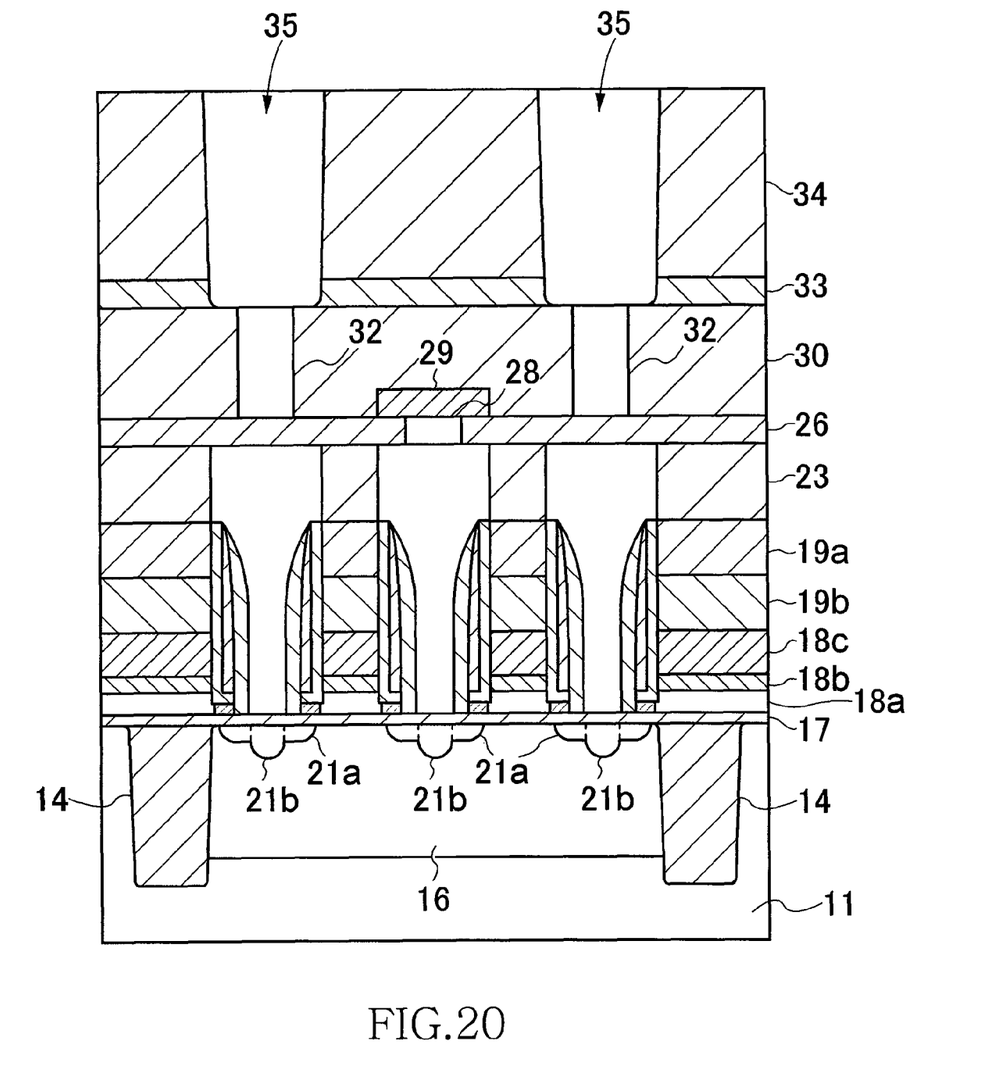
FIG. 20 is a schematic cross section of one process (a formation of a silicon nitride film 32 to a formation of capacitor trenches 34) of the method of manufacturing a semiconductor device according to the embodiment.
Figure 21:
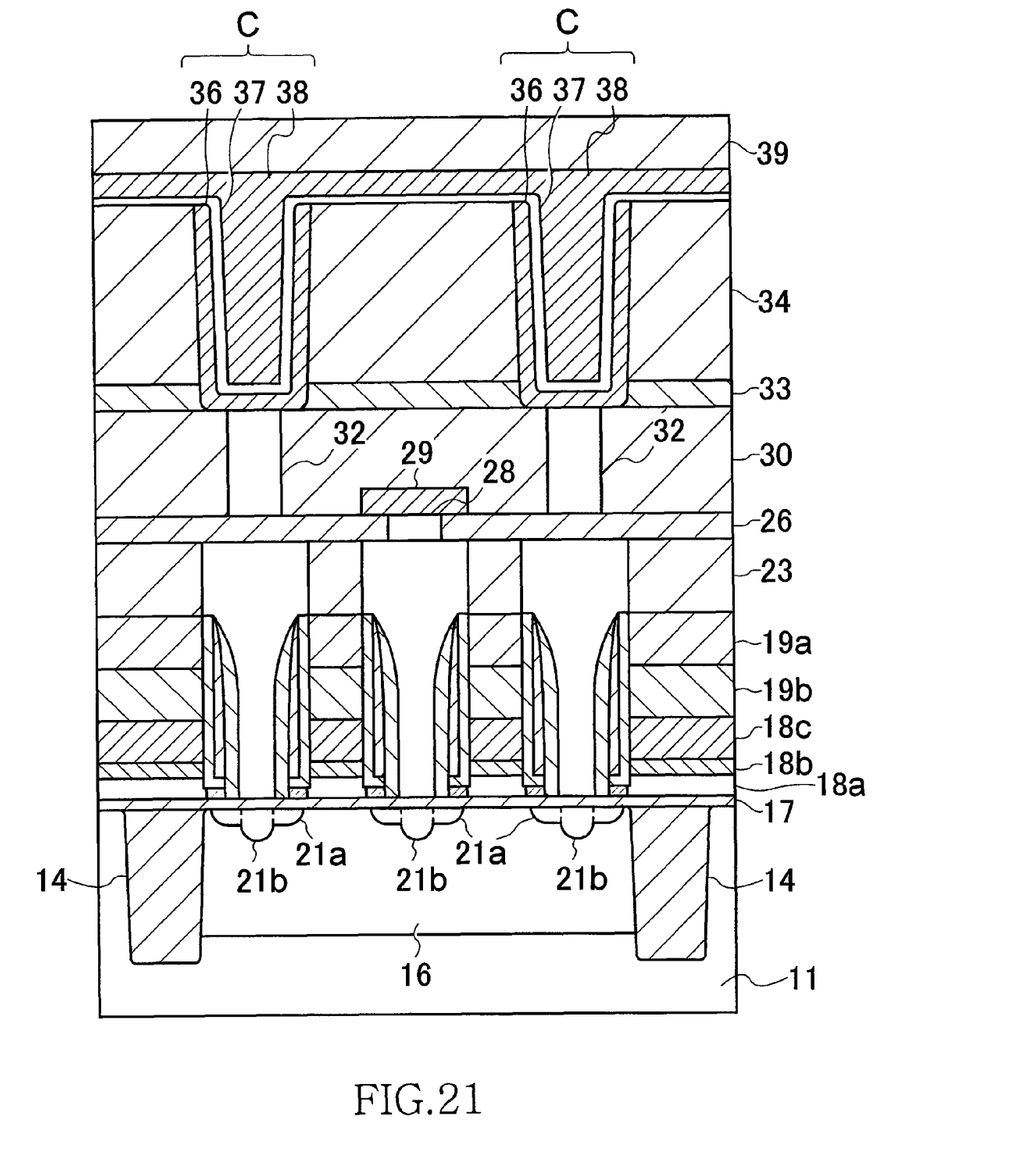
FIG. 21 is a schematic cross section of one process (a formation of a capacitor C) of the method of manufacturing a semiconductor device according to the embodiment.

After second plugs 31 are formed inside the second through-holes 30, a silicon nitride film 32 and a silicon oxide film 33 are deposited, and these films are dry etched to form capacitor trenches 34 on the upper part of the second plugs 31, as shown in FIG. 20. Next, as shown in FIG. 21, lower electrodes 35, each consisting of a low-resistance poly-silicon film, are formed on the inner walls of the capacitor trenches 34. Thereafter, an dielectric film 36 consisting of tantalum oxide film or the like and an upper electrode 37 consisting of a conductive film such as a TiN film and a W film are sequentially formed, thereby forming a capacitor C. Through the above process, a memory cell of the DRAM having the MOSFET and the capacitor connected in series is completed.

Thereafter, a silicon oxide film 38 is deposited on the upper part of the semiconductor substrate 11 formed with the above films, by the CVD method, and a necessary wiring (not shown) is formed. Accordingly, the DRAM according to the present embodiment is substantially completed.

As explained above, according to the present embodiment, the side surfaces of the tungsten film 18c and the tungsten nitride film 18b are covered with a double sidewall consisting of the silicon nitride film and the silicon oxide film. Therefore, in the process of forming the light oxide film 18x, a scattering of tungsten and its oxide can be securely prevented. Accordingly, a leak current from the memory cell decreases substantially, and refresh characteristic can be improved.

The present invention is not limited by the above embodiments, and various modifications may be made within the scope of the appended claims, which will be also covered by the scope of the invention.

While a DRAM is taken as an example in the above embodiment, the method of manufacturing a semiconductor device according to the present invention is not limited to the DRAM, and can be also applied to all kinds of semiconductor devices having a gate electrode of a poly-metal structure.

While the tungsten film 18c is used as a refractory metal film of a poly-metal gate electrode, other refractory metal film such as a titanium (Ti) film can be also used.

While a tungsten nitride film is directly formed on the surface of a poly-silicon film in the above embodiment, an alloy film (a tungsten silicide (WSix) film) of tungsten and silicon can be also provided between the poly-silicon film 13a and the tungsten nitride film in order to improve close adhesiveness.

While the sidewall includes a double film of a silicon nitride film and a silicon oxide film in the above embodiment, the sidewall can also include three films of a silicon nitride film, a silicon oxide film, and a silicon nitride film. In other words, the sidewall according to the present invention can include two or more films.

As explained above, according to the present invention, since a scattering of a refractory metal contained in the poly-metal gate electrode can be prevented more effectively, junction leakage attributable to the refractory metal can be further reduced. Consequently, when the present invention is applied to a memory cell transistor of a DRAM, a junction leakage current in the diffused area connected to a lower electrode of a memory capacitor can be reduced, and a leakage of electric charge stored in the memory cell capacitor can be reduced. Therefore, the refresh characteristic can be substantially increased.

What is claimed is:

1. A method of manufacturing a semiconductor device, comprising:
   a first step of forming a gate dielectric film on a semiconductor substrate;

a second step of forming at least a poly-silicon film and a refractory metal film on the gate dielectric film;

a third step of patterning at least the refractory metal film to form a patterned refractory metal film that includes first and second side surfaces;

a fourth step of forming first and second sidewalls respectively on the first and second side surfaces of the patterned refractory metal film, each of the first and second sidewalls comprising first and second insulating layers that are different in material from each other, the first insulating layer intervening between an associated one of the first and second side surfaces of the patterned refractory metal film and the second insulating layer;

a fifth step of patterning the poly-silicon film by using the first and second sidewalls as a mask to form a patterned poly-silicon film that includes third and fourth side surfaces; and a sixth step of oxidizing the third and fourth side surfaces of the patterned poly-silicon film.

2. The method of manufacturing the semiconductor device as claimed in claim 1, wherein the fourth step includes:
a step of depositing a silicon nitride film as the first insulating layer;
a step of depositing a silicon oxide film as the second insulating layer on the silicon nitride film;
a step of etching back the silicon oxide film; and
a step of etching the silicon nitride film using the silicon oxide film as a mask.

3. A method comprising:
forming a gate insulating film over a substrate;
forming a polysilicon layer over the gate insulating film, the polysilicon layer comprising a first layer portion and a second layer portion, the first layer portion being sandwiched between the gate insulating film and the second layer portion;
forming a metal layer over the polysilicon layer;
selectively forming a cap insulating layer over the metal layer to define first and second portions in the metal layer that are covered and uncovered respectively with the cap insulating layer, the polysilicon layer including first and second portions that correspond respectively to the first and second portions of the metal layer;
performing a selective etching by use of the cap insulating layer to remove the second portion of the metal layer and the second layer portion of the polysilicon layer that belongs to the second portion of the polysilicon layer while leaving the first layer portion of the polysilicon layer that belongs to the second portion of the polysilicon layer, so that a side surface of the first portion of the metal layer, a side surface of the second layer portion of the polysilicon layer that belongs to the first portion of the polysilicon layer and an upper surface of the first layer portion of the polysilicon layer that belongs to the second portion of the polysilicon layer are exposed;
forming a first insulating film to cover the cap insulating layer, the side surface of the first portion of the metal layer, the side surface of the second layer portion of the polysilicon layer that belongs to the first portion of the polysilicon layer and the upper surface of the first layer portion of the polysilicon layer that belongs to the second portion of the polysilicon layer;
forming a second insulating film over the first insulating film;
etching back the second insulating film to expose parts of the first insulating film that correspond respectively to an upper surface of the cap insulating layer and a part of the upper surface of the first layer portion of the polysilicon layer that belongs to the second portion of the polysilicon layer;
removing the parts of the first insulating film to expose the upper surface of the cap insulating layer and the part of the upper surface of the first layer portion of the polysilicon layer that belongs to the second portion of the polysilicon layer;
removing the part of the upper surface of the first layer portion of the polysilicon layer that belongs to the second portion of the polysilicon layer to expose a part of the gate insulating film, a side surface extending from a remaining part of the upper surface of the first layer portion of the polysilicon layer that belongs to the second portion of the polysilicon layer being thereby exposed; and
oxidizing the side surface extending from the remaining part of the upper surface of the first layer portion of the polysilicon layer that belongs to the second portion of the polysilicon layer to form an oxide film on the side surface extending from the remaining part of the upper surface of the first layer portion of the polysilicon layer that belongs to the second portion of the polysilicon layer.

4. The method as claimed in claim 3, further comprising:
forming a third insulating film over an entire surface and etching after the oxidizing; and
etching back the third insulating film to form a side spacer over the oxide film on the side surface extending from the remaining part of the upper surface of the first layer portion of the polysilicon layer that belongs to the second portion of the polysilicon layer.

5. The method as claimed in claim 3, wherein the first insulating film comprises a silicon nitride film and the second insulating film comprises a silicon oxide film.

6. The method as claimed in claim 4, wherein each of the first and third insulating films comprises a silicon nitride film and the second insulating film comprises a silicon oxide film.

7. The method as claimed in claim 4, further comprising forming impurity regions in the substrate after the oxidizing and before the forming the third insulating film.

8. A method comprising:
a first step for forming a gate insulating film over a semiconductor substrate;
a second step for forming at least a polysilicon layer and a refractory metal layer on the gate insulating film;
a third step for patterning the refractory metal layer to form a patterned refractory metal layer that includes first and second side surfaces;
a fourth step for forming first and second sidewalls respectively on the first and second side surfaces of the patterned refractory metal layer, each of the first and second sidewalls comprising first and second insulating layers that are different in material from each other, the first insulating layer intervening between an associated one of the first and second side surfaces of the patterned refractory metal layer and the second insulating layer;
a fifth step for patterning the polysilicon layer by using the first and second sidewalls as a mask to form a patterned polysilicon layer that includes third and fourth side surfaces; and
a sixth step for oxidizing the third and fourth side surfaces of the patterned polysilicon layer, wherein the fourth step includes:
depositing a silicon nitride film as the first insulating layer;
depositing a silicon oxide film as the second insulating layer on the silicon nitride film;

etching back the silicon oxide film; and etching the silicon nitride film by using a remaining silicon oxide film as a mask, wherein the sixth step is performed after performing the first to fifth steps.

9. The method as claimed in claim 8, wherein the silicon oxide film serves as a protection film to protect the silicon nitride film during etching the silicon nitride film, and the silicon nitride film the silicon oxide film serve as a cover member to prevent the refractory metal layer from scattering during the sixth step.

10. The method as claimed in claim 8, further comprising a seventh step after the sixth step for forming a diffused area by ion implantation of impurity ions.

* * * * *